(12) United States Patent  
Wuu et al.

(10) Patent No.: US 9,159,409 B2  
(45) Date of Patent: Oct. 13, 2015

(54) METHOD AND APPARATUS FOR PROVIDING COMPLIMENTARY STATE RETENTION

(71) Applicant: Advanced Micro Devices, Inc., Sunnyvale, CA (US)

(72) Inventors: John J. Wuu, Fort Collins, CO (US); Donald R. Weiss, Fort Collins, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 152 days.

(21) Appl. No.: 13/623,937

(22) Filed: Sep. 21, 2012

(65) Prior Publication Data

US 2013/0069964 A1      Mar. 21, 2013

Related U.S. Application Data

(63) Continuation-in-part of application No. 13/561,547, filed on Jul. 30, 2012.

(60) Provisional application No. 61/535,730, filed on Sep. 16, 2011.

(51) Int. Cl.
*G11C 14/00* (2006.01)
*G11C 13/00* (2006.01)

(52) U.S. Cl.
CPC ........ *G11C 13/0004* (2013.01); *G11C 13/0007* (2013.01); *G11C 13/0033* (2013.01); *G11C 13/0061* (2013.01); *G11C 14/009* (2013.01); *G11C 14/0081* (2013.01); *G11C 2213/77* (2013.01)

(58) Field of Classification Search
CPC ............. G11C 14/009; G11C 14/0045; G11C 14/0081; H01L 27/01
USPC ...................... 365/148.1, 185.08, 154; 712/12
See application file for complete search history.

(56) References Cited

U.S. PATENT DOCUMENTS

| | | | |
|---|---|---|---|
| 5,021,993 A | 6/1991 | Matoba et al. | |
| 6,014,132 A | 1/2000 | Shimada et al. | |
| 6,223,279 B1 | 4/2001 | Nishimura et al. | |
| 8,879,301 B2 | 11/2014 | Mayhew et al. | |
| 2007/0002619 A1* | 1/2007 | Schoenauer et al. | 365/185.08 |
| 2007/0022428 A1 | 1/2007 | Yamasaki | |
| 2007/0165446 A1* | 7/2007 | Oliva et al. | 365/154 |
| 2008/0090337 A1 | 4/2008 | Williams | |
| 2008/0225590 A1 | 9/2008 | Lamorey | |
| 2008/0229269 A1* | 9/2008 | Lamorey | 716/12 |
| 2010/0073991 A1* | 3/2010 | Yamada et al. | 365/148 |
| 2013/0070513 A1 | 3/2013 | Weiss et al. | |
| 2013/0117593 A1 | 5/2013 | Nooney et al. | |

* cited by examiner

*Primary Examiner* — J. H. Hur
*Assistant Examiner* — Ajay Ojha
(74) *Attorney, Agent, or Firm* — Faegre Baker Daniels LLP

(57) ABSTRACT

A method, integrated circuit and apparatus are operative to control a plurality of passive variable resistance memory cells to store complimentary state information from at least one active memory circuit, such as a flop, latch, or any other suitable state generation circuit. The method, apparatus and integrated circuit may be operative to control the plurality of passive variable resistance memory cells to also restore the stored complimentary state information for the at least one active memory.

17 Claims, 11 Drawing Sheets

METHOD AND APPARATUS FOR PROVIDING COMPLIMENTARY STATE RETENTION

RELATED APPLICATIONS

This application is a continuation-in-part to co-pending non-provisional application Ser. No. 13/561,547, filed on Jul. 30, 2012, having inventors Donald R. Weiss et al., titled "METHOD AND APPARATUS FOR DIRECT BACKUP OF MEMORY CIRCUIT", owned by instant assignee and incorporated herein by reference, which claims priority to provisional application Ser. No. 61/535,730, filed on Sep. 16, 2011, having inventors Don R. Weiss et al., titled "METHOD AND APPARATUS FOR DIRECT BACKUP OF MEMORY CIRCUIT", which is related to co-pending Provisional Application Ser. No. 61/535,733, filed on Sep. 16, 2011, having inventors David Mayhew et al., titled "METHOD AND APPARATUS FOR CONTROLLING STATE INFORMATION RETENTION IN AN APPARATUS", and incorporated herein by reference.

BACKGROUND OF THE INVENTION

The disclosure relates generally to circuits and methods to backup state information in integrated circuits and more particularly to circuits and methods that save the state of the processor or logic chip and methods for performing same.

Logic chips and processors such as central processing units (CPUs), graphics processing units (GPUs), DSPs and other processing circuits employ known solutions to save the state information that are in various locations throughout the processor when, for example, power is to be shut down on the device or for switching to handle different processing threads or for other suitable purposes. Flip-flops as known in the art may be used in pipelines to store state information and may be used, for example, in state machines or any other suitable structure to allow devices to start and stop when power is to be removed, for example or if a pipeline is to be temporarily held to allow another thread to be processed. Saving the state of the processor can involve the tedious process of reading all of the architected states of the chip (or part of the chip) that is to be powered off and saved out to a section of the chip not to be powered off or power gated. Other solutions utilize the writing of the state of the chip onto a system bus to an off-chip non-volatile storage device that retains the data after power has been removed, such as a ROM disk or other non-volatile storage.

FIG. 1 illustrates one example of a prior art device 100 that employs a chip or system bus 102 that communicate with a non-volatile disk memory 104 (e.g., hard drive) or other storage 106. An integrated circuit chip 108 (e.g., die or packaged die) may be connected to the disk memory 104 via the chip or system bus 102. The integrated circuit chip 108 may include, for example, an input/output stage 110, cache memory 112, register files 114 and one or more execution units 116. Control logic 118 provides control of the various stages to effect processing. Active memory circuits (e.g., that are made from CMOS transistors or other active memory structures) in the form of flip-flops 120, for example, may be used to store information throughout the integrated circuit as well. Other memory circuits such as the register file, as known in the art, may store state elements for computations for the execution unit. The flip-flops 120 store states of the processor and the cache memory 112 may be SRAM cache or other suitable cache. Memory circuits such as flip-flops, registers, register files, SRAM and other memory circuits that store state information can be quite voluminous particularly in complex processors such as CPUs, GPUs and other processors. Memory circuits as used herein include, for example, active memory circuits that employ, for example, active transistors such as CMOS transistors or other suitable active devices. The flip-flops 120 may be connected to scan chains that are used for testing the integrated circuit prior to packaging and may also be used to scan out state information from various circuits in the chip prior to power down as known in the art. The scan chains may typically operate at a low frequency such as 100 MHz and typically scan out state data in a serialized fashion which can take an inordinate amount of time. The state information may be saved onto the non-volatile disk 104. Once stored, power to the section of the chip or system can be removed. This is sometimes referred to as power gating.

To restore the state, the reverse process is executed. The section of the chip, entire chip or system is powered up and the state is restored to its previous state from the save location and execution is resumed from the previous store point. Such state saving techniques can require significant amounts of power to save and restore the state of entire sections of a chip, the entire chip or system. This can defeat the purpose of power gating in an integrated circuit which allows the reduction or removal of power from subsections or portions of the chip to save power when they are not in use or otherwise slow down the operation to conserve power. Such power gating is useful for mobile devices for example. Such power gated integrated circuits may be used, for example, in handheld devices such as smart phones, laptops, tablet devices or any other suitable mobile devices. Energy efficiency is becoming more commonplace in non-mobile devices as well.

It is also known in the art to use shadow flip-flops that are active circuits that are connected to active flip-flops to attempt to save state. However, shadow flip-flops are typically connected to a separate supply voltage to keep the flip-flop on during power gating so that the data is not lost. This results in additional leakage current from the many shadow flip-flops that are employed to save state, drawing unnecessary power and adding unnecessary temperature increases.

Also, known retention circuits require a separate supply that stays powered while the regular supply to the combinational circuits is powered down. A drawback with such an approach includes that the design complexity with the separate power supply. In addition, the circuitry including the retention state circuits typically continue to draw power during power down mode. Accordingly, such solutions may keep entire flops on separate power supplies that do not get powered down or have a separate retention portion (essentially a separate state element) on a separate supply. However, the extra power supply design results in additional costs, additional metal tracks and design effort. In addition, the circuitry that is left powered on typically continue to consume power.

Other solutions may include the saving of state information in active state elements in separate storage such as an off chip memory, non-powered down caches, etc. However, such approaches can significantly lengthen the required time for entering and exiting powered down modes. Other disadvantages will be recognized by those of ordinary skill in the art.

A need exists for an improved state saving circuit, apparatus and method.

BRIEF DESCRIPTION OF THE DRAWINGS

The invention will be more readily understood in view of the following description when accompanied by the below figures and wherein like reference numerals represent like elements, wherein.

DETAILED DESCRIPTION OF THE PREFERRED EMBODIMENTS

Figure 1:
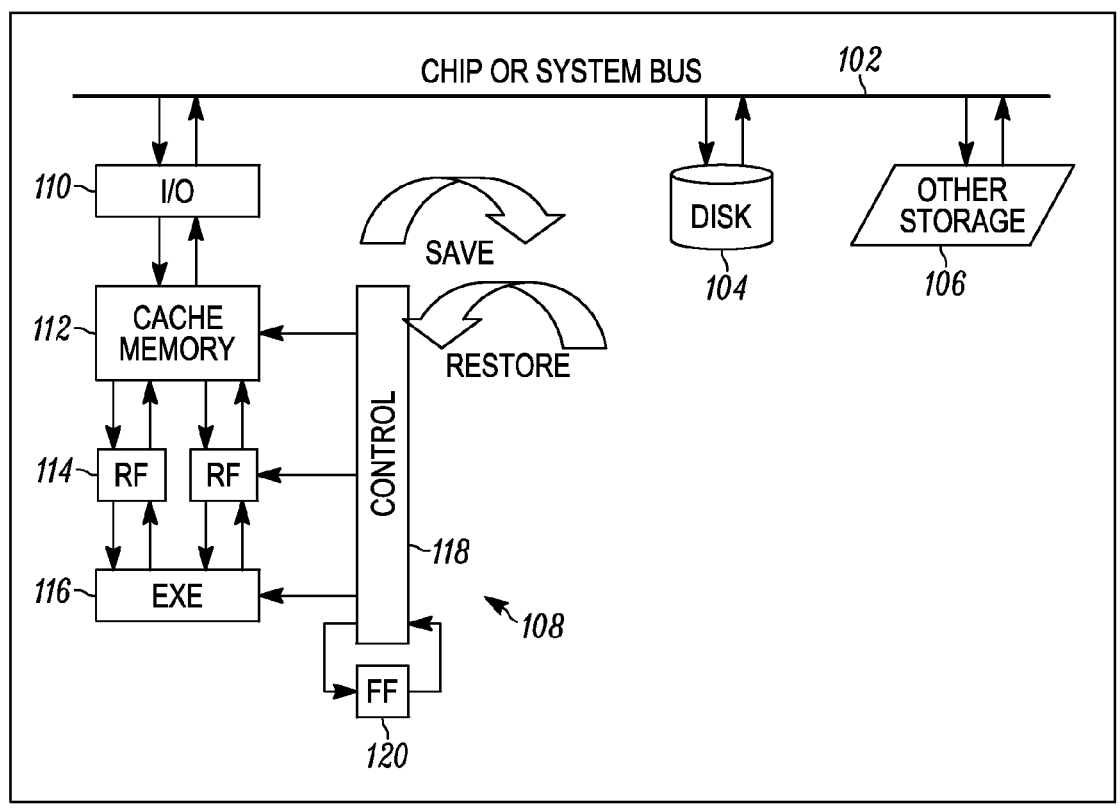
FIG. 1 is a block diagram illustrating one example of a prior art system that employs a state saving operation.

Briefly, a method, integrated circuit and apparatus are operative to control a plurality of passive variable resistance memory cells to store complimentary state information from at least one active memory circuit, such as a flop, latch, or any other suitable state generation circuit. The method, apparatus and integrated circuit may be operative to control the plurality of passive variable resistance memory cells to also restore the stored complimentary state information for the at least one active memory.

In one example, the at least one variable resistance state retention circuit includes at least one variable resistance cross coupled configured state retention circuit that includes a plurality of passive variable resistance memory (PVRM) cells in a cross coupled configuration. Control logic controls the PVRM cells to save complimentary state information from at least one active memory circuit. The control logic is also operative to restore the stored state information from the plurality of passive variable resistance memory cells by configuring the plurality of passive variable resistance memory cells in a voltage divider configuration. In one example, the passive variable resistance memory cells in the cross coupled configuration includes a pass gate transistor to provide cross coupling of the PVRM cells. In one example, a variable resistance state retention circuit employs cross coupled PVRM devices to write complimentary state information allowing the writing of opposite values from existing cross coupled inverters in a latch. During read operations, the cross coupled PVRMs are turned into series PVRMs thus providing a voltage divider for simple sensing. In another example, diode drops in a read path can limit voltages during read operations to prevent over writing the PVRM cells.

Among other advantages, non-volatile storage, such as variable resistance memory cells are used allowing the state generators such as flops to be completely powered down during power down modes. The variable resistance state retention circuit does not require a separate supply for powering the retention circuitry and does not require delay overhead for entering/exiting power down modes, compared to solutions that store state element values in separate storages. Another advantage may include a compact design that is more efficient than conventional designs. Another advantage may include avoiding separate read and write circuitries, for example, not using sensing structures such as current sense amplifiers that can introduce higher area overhead and increase complexity and cost. Other advantages will be recognized by those of ordinary skill in the art.

In one example, the passive variable resistance memory state save and restore control logic provides at least a save signal, a restore signal, and a precharge signal to control the at least one variable resistance cross coupled configured state retention circuit in response to a power change condition.

In one example, control logic, during a state save operation is operative to provide opposite voltage polarities across each of at least two of the passive variable resistance memory cells in the cross coupled configuration and in one example, a plurality of cross coupled inverters provide complimentary state information for storage by the PVRM cells in the cross coupled configuration.

In another embodiment, an apparatus such as a server, handheld device, tablet device, personal computer, laptop or any other suitable device includes an input/output device, such as but not limited to a keypad or other suitable input/output device and at least one processor that may include one or more processing cores that includes the variable resistance state retention circuit. In addition, if desired a display may also be employed in the apparatus to display information based on operation of the processor.

Also, in a different embodiment, an integrated circuit employs at least one active memory circuit and at least one memory state backup circuit wherein at least one memory state backup circuit includes at least one passive variable resistance memory (PVRM) cell and at least one passive variable resistance memory cell interface that are used to backup data from the active memory circuit to the PVRM cell. Data is then placed back into the active memory circuit from the PVRM cell during a restore operation. The PVRM cell interface is operative to read the PVRM cell in response to a restore signal. PVRM cell interface control logic is operative to remove power to the PVRM cell after backup of the data to the PVRM cell from the active memory circuit. A PVRM cell (e.g., a bit cell) is added to each memory circuit that stores state information on an integrated circuit. At the point of power gating the memory circuit, the data therein is transferred from the volatile section of the active memory circuit into the non-volatile PVRM cell using the appropriate save control signals. Once the PVRM cell is populated, power may be removed from the active memory circuit and from the PVRM cell since it is a non-volatile storage mechanism. Once data is restored to the memory circuit using restore control signals, the normal operation of the memory circuit may resume.

In one example, a new flip-flop design is employed that may provide direct backup of data in a flip-flop. In another example, the PVRM cell is written to each time the memory circuit is written to provide an always backed up and ready to be power gated flip-flop. In another example, a flip-flop or other memory circuit employs an active master latch stage and subsequent (serial) passive variable resistance memory based slave stage that stores the state from the master latch each time data is latched in the master latch.

Among other benefits, simplified power gating may be employed on a circuit, system level or integrated circuit level as there is no need to provide methods and paths to read the state of each flip-flop, register file and SRAM. Instead, when the clock is stopped to a flip-flop, for example, the data in the active memory circuit is captured in the co-resident passive variable resistance memory cell and power can be removed to the circuit. In order to return to the operational state, the power can be turned back on for the flip-flop and the state of the co-resident passive variable memory cell can be immediately written to the memory circuit and the clock can be started again. The resulting operation can be much faster than conventional techniques and more efficient allowing power savings over smaller intervals of time and may be easier to implement since the passive variable resistance cell can be built as co-resident with a flip-flop within an integrated circuit. In addition, power to the passive variable resistance memory cells can also be removed providing additional power savings. Since the passive variable resistance state backup circuitry is located on-die, the power supply of the chip may be shut off without losing state information on a chip level. Other benefits will be recognized by those of ordinary skill in the art.

Figure 2:
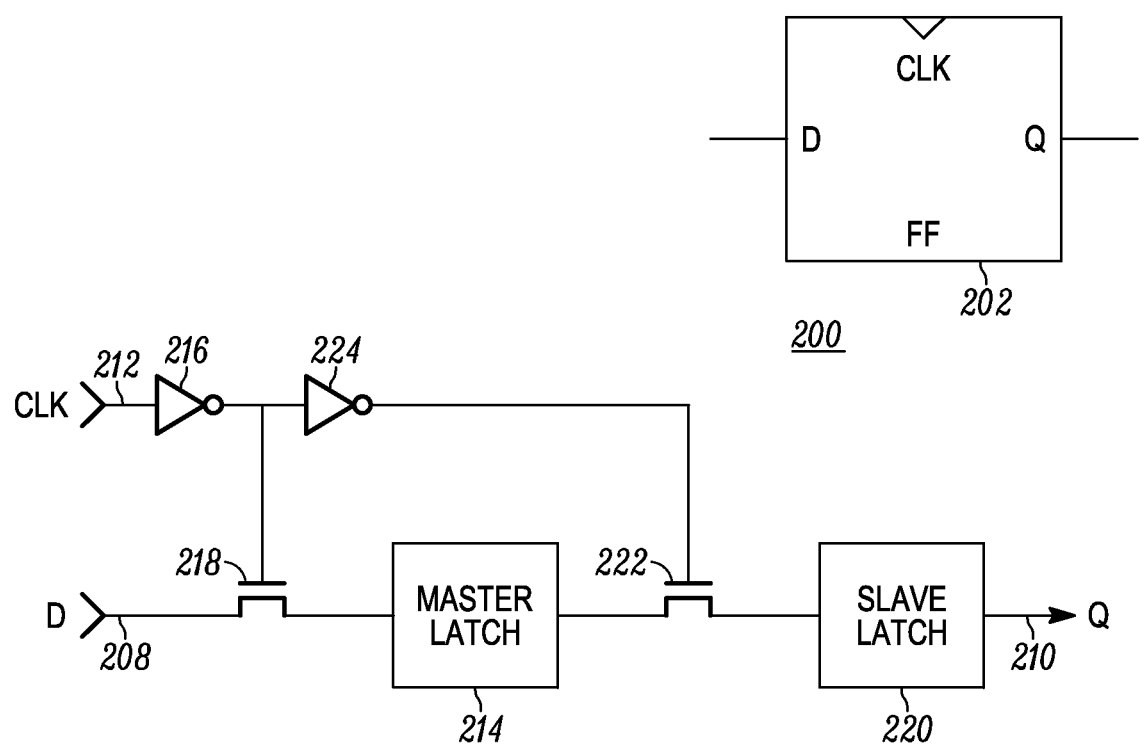
FIG. 2 is a block diagram illustrating one example of a prior art flip-flop.

FIG. 2 illustrates a prior art flip-flop circuit 200 made with active devices as known in the art. A block diagram of the flip-flop is shown as block 202. The active memory circuit 200, in this case a flip-flop, receives input data 208 on an input of the memory circuit and generates an output Q 210. A clock input 212 clocks the data into a master latch 214 through an inverter 216 and a switch transistor 218 as known in the art. A slave latch 220 has an input connected to the output of the master latch through a second switch transistor 222 that receives the output from a second inverter 224 as known in the art. The switch transistor 222 passes output data from the master latch 214 based on the clock input signal 212 to the slave latch 220. The clock signal 212 may be generated by any suitable clock source as known in the art.

Figure 3:
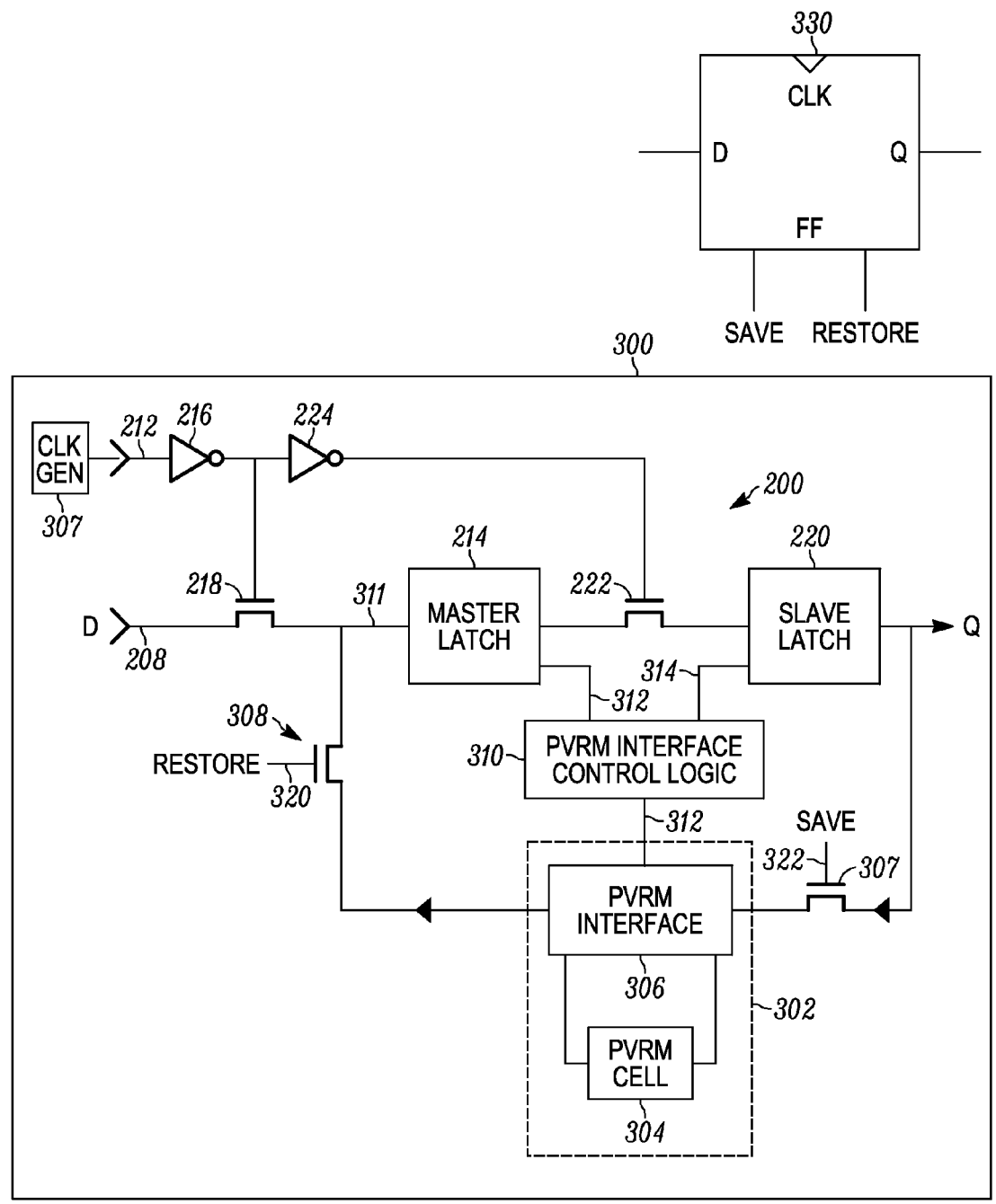
FIG. 3 is a block diagram illustrating one example of an integrated circuit employing a memory state backup circuit in accordance with one example set forth in the disclosure.

FIG. 3 illustrates one example of an integrated circuit 300 employing an active memory circuit 200, in this example a flip-flop of the type shown in FIG. 2 and at least one memory state backup circuit 302 that is connected to the active memory circuit 200. The memory state backup circuit 302 includes at least one passive variable resistance memory (PVRM) cell 304 which in this example is illustrated as being a 1 bit cell, and at least one PVRM cell interface 306 that is coupled to the active memory circuit in this example through a save switch 307 and restore switch 308. The switches are shown to be active CMOS transistors, but other types of switches may also be used. The PVRM cell interface 306 and PVRM cell 304 backup data from the active memory circuit 200. The PVRM cell interface 306 controls reads and writes (e.g., the setting of a resistance value and sensing thereof) to the PVRM cell to back up data from the active memory circuit 200 to the PVRM cell 304 and can be constructed as known in the art. The integrated circuit 300 also includes PVRM cell interface control logic 310 that provides a power control signal 312 to the PVRM cell interface 306 to remove power to the PVRM cell after backup of the data from the active memory circuit to the PVRM cell. The PVRM cell interface control logic 310 may be made from active circuits such as transistors, state machines, programmed processors or any suitable logic to operate as described herein. In operation, the PVRM cell interface control logic 310 also may control power (e.g., remove or add) to the slave latch and master latch shown by power control signals 312 and 314 or other logic in the circuit if desired. However, separate power control logic may be employed if desired.

FIG. 3 illustrates a clock circuit 307 that is coupled to the input of the switch 222 provide clocking of the switch. The clock circuit may be any suitable clock generation circuit as known in the art.

The PVRM interface 306 controls the PVRM cell to store a logical 1 when the save switch is closed and Q is a logical 1 and stores a 0 if Q is 0. Other logic levels may also be used. For example, since the PVRM cell is a passive variable resistance structure, the single bit can be used to represent multiple states.

The restore switch 308 is coupled to an input 311 of the active memory circuit, in this example to the input of master latch 214 and to an output of the PVRM cell interface 306. The restore switch 308 is responsive to a restore signal 320 to cause the backup data in the PVRM cell to be input to the active memory circuit (e.g., the master latch). The PVRM interface reads out the PVRM value when the restore switch 308 is active. The save switch 307 is coupled to an output of the active memory circuit 200 and in this case, is coupled to the output of slave latch 220 and is also coupled to an input of the PVRM interface 306. The save switch is responsive to a backup signal 322 to pass data from the active memory circuit for example stored in slave latch 220 to PVRM cell 304. The control signals such as the save signal 322 and the restore signal 320 may be generated by any suitable control logic such as a processor executing a software application on the integrated circuit 300, dedicated hardware that automatically controls the state store operation during power gating, or any other suitable control mechanism. FIG. 3 also illustrates a diagrammatic representation 330 of the circuit shown illustrating a new flip-flop circuit with a built-in non-volatile state store mechanism which in this example is done with a passive memory circuit configuration.

The passive variable resistance memory cell 304 may be formed by thin-film deposition techniques such as CVD, thermal evaporation, sputtering, MBE, electroplating, spin-coating, or any other suitable techniques. The material of the passive variable resistance memory cell may be any suitable variable resistance material that is capable of storing state by resistance. Depending on the specific type of passive variable resistance memory, the material of the passive variable resistance memory layer may include, for example, one or more thin-film oxides (e.g., $TiO_2$, $SiO_2$, $NiO$, $CeO_2$, $VO_2$, $V_2O_5$, $Nb_2O_5$, $Ti_2O_3$, $WO_3$, $Ta_2O_5$, $ZrO_2$, IZO, ITO, etc.) for memristors, chalcogenide for phase-change memory, and ferromagnetic materials (e.g., CoFeB incorporated in MgO) for magnetoresistive memory.

It is known in the art that memory may be implemented by an array of memory cells. Each memory cell of the array includes a memory region as a place to store state, which represents one bit of information. In order to access each memory cell, the array of memory is organized by rows and columns, and the intersection point of each row-column pair is a memory region. The rows are also called word lines, whereas the columns are named bit lines.

In this example embodiment, the passive variable resistance memory cell 304 (e.g. one bit) may be a memristor of any suitable design. The passive variable resistance memory cell in this example embodiment, is implemented as a memory layer including a memristor passive variable-resistive memory cell (e.g., each 1 bit) and may be of any suitable design. Since a memristor includes a memory region (e.g., a layer of $TiO_2$) between two metal contacts (e.g., platinum wires), memristors could be accessed in a cross point array style (i.e., crossed-wire pairs) with alternating current to non-destructively read out the resistance of each memory cell. A cross point array is an array of memory regions that can connect each wire in one set of parallel wires to every member of a second set of parallel wires that intersects the first set (usually the two sets of wires are perpendicular to each other, but this is not a necessary condition). The memristor disclosed herein may be fabricated using a wide range of material deposition and processing techniques. One example is disclosed in corresponding U.S. Patent Application Publication No. 2008/0090337, having a title "ELECTRICALLY ACTUATED SWITCH", which is incorporated herein by reference.

In this example, first, a lower electrode is fabricated above the actual memory cell using conventional techniques such as photolithography or electron beam lithography, or by more advanced techniques, such as imprint lithography. This may be, for example, a bottom wire of a crossed-wire pair. The material of the lower electrode may be either metal or semiconductor material, preferably, platinum.

In this example, the next component of the memristor to be fabricated is the non-covalent interface layer, and may be omitted if greater mechanical strength is required, at the expense of slower switching at higher applied voltages. In this case, a layer of some inert material is deposited. This could be a molecular monolayer formed by a Langmuir-Blodgett (LB) process or it could be a self-assembled monolayer (SAM). In general, this interface layer may form only weak van der Waals-type bonds to the lower electrode and a primary layer of the memory region. Alternatively, this interface layer may be a thin layer of ice deposited onto a cooled substrate. The material to form the ice may be an inert gas such as argon, or it could be a species such as $CO_2$. In this case, the ice is a sacrificial layer that prevents strong chemical bonding between the lower electrode and the primary layer, and is lost from the system by heating the substrate later in the processing sequence to sublime the ice away. One skilled in this art can easily conceive of other ways to form weakly bonded interfaces between the lower electrode and the primary layer.

Next, the material for the primary layer is deposited. This can be done by a wide variety of conventional physical and chemical techniques, including evaporation from a Knudsen cell, electron beam evaporation from a crucible, sputtering from a target, or various forms of chemical vapor or beam growth from reactive precursors. The film may be in the range from 1 to 30 nanometers (nm) thick, and it may be grown to be free of dopants. Depending on the thickness of the primary layer, it may be nanocrystalline, nanoporous or amorphous in order to increase the speed with which ions can drift in the material to achieve doping by ion injection or undoping by ion ejection from the primary layer. Appropriate growth conditions, such as deposition speed and substrate temperature, may be chosen to achieve the chemical composition and local atomic structure desired for this initially insulating or low conductivity primary layer.

The next layer is a dopant source layer, or a secondary layer, for the primary layer, which may also be deposited by any of the techniques mentioned above. This material is chosen to provide the appropriate doping species for the primary layer. This secondary layer is chosen to be chemically compatible with the primary layer, e.g., the two materials should not react chemically and irreversibly with each other to form a third material. One example of a pair of materials that can be used as the primary and secondary layers is $TiO_2$ and $TiO_{2-x}$, respectively. $TiO_2$ is a semiconductor with an approximately 3.2 eV bandgap. It is also a weak ionic conductor. A thin film of $TiO_2$ creates the tunnel barrier, and the $TiO_{2-x}$ forms an ideal source of oxygen vacancies to dope the $TiO_2$ and make it conductive.

Finally, the upper electrode in the passive variable resistance memory layer is fabricated on top of the secondary layer in a manner similar to which the lower electrode was created. This may be, for example, a top wire of a crossed-wire pair. The material of the upper electrode may be either metal or semiconductor material, preferably, platinum. If the memory cell is in a cross point array style, an etching process may be necessary to remove the deposited memory region material that is not under the top wires in order to isolate the memory cell. It is understood, however, that any other suitable material deposition and processing techniques may be used to fabricate memristors for the passive variable-resistive memory. It will also be recognized that any other suitable passive variable resistance technology may be employed as mentioned above or that the order of operation may be rearranged in any suitable manner.

It will be understood that PVRM is a term used to describe any memory technology that stores state in the form of resistance instead of charge. That is, PVRM technologies use the resistance of a cell to store the state of a bit, in contrast to charge-based memory technologies that use electric charge to store the state of a bit. PVRM is referred to as being passive due to the fact that it does not require any active semiconductor devices, such as transistors, to act as switches. These types of memory are said to be "non-volatile" due to the fact that they retain state information following a power loss or power cycle. Passive variable resistive memory is also known as resistive non-volatile random access memory (RNVRAM or RRAM).

Examples of PVRM include, but are not limited to, Ferroelectric RAM (FeRAM), Magnetoresistive RAM (MRAM), Memristors, PRAM, Phase Change Memory (PCM), and Spin-Torque Transfer MRAM (STT-MRAM). While any of these technologies may be suitable for use in the IC 102 disclosed herein, PCM, memristors, and STT-MRAM are discussed below in additional detail.

Phase change memory (PCM) is a PVRM technology that relies on the properties of a phase change material, generally chalcogenides, to store state. Writes are performed by injecting current into the storage device, thermally heating the phase change material. An abrupt shutoff of current causes the material to freeze in an amorphous state, which has high resistivity, whereas a slow, gradual reduction in current results in the formation of crystals in the material. The crystalline state has lower resistance than the amorphous state; thus a value of 1 or 0 corresponds to the resistivity of a cell. Varied current reduction slopes can produce in-between states, allowing for potential multi-level cells. A PCM storage element consists of a heating resistor and chalcogenide between electrodes, while a PCM cell is comprised of the storage element and an access transistor.

Memristors are commonly referred to as the "fourth circuit element," the other three being the resistor, the capacitor, and the inductor. A memristor is essentially a two-terminal variable resistor, with resistance dependent upon the amount of charge that passed between the terminals. Thus, a memristor's resistance varies with the amount of current going through it, and that resistance is remembered even when the current flow is stopped.

Spin-Torque Transfer Magnetoresistive RAM (STT-MRAM) is a second-generation version of MRAM, the original of which was deemed "prototypical" by the International Technology Roadmap for Semiconductors (ITRS). MRAM stores information in the form of a magnetic tunnel junction (MTJ), which separates two ferromagnetic materials with a layer of thin insulating material. The storage value changes when one layer switches to align with or oppose the direction of its counterpart layer, which then affects the junction's resistance. Original MRAM required an adequate magnetic field in order to induce this change. This was both difficult and inefficient, resulting in impractically high write energy. STT-MRAM uses spin-polarized current to reverse polarity without needing an external magnetic field. Thus, the STT technique reduces write energy as well as eliminating the difficult aspect of producing reliable and adequately strengthen magnetic fields. However, STT-MRAM, like PCM, requires an access transistor and thus its cell size scaling depends on transistor scaling.

Figure 4:
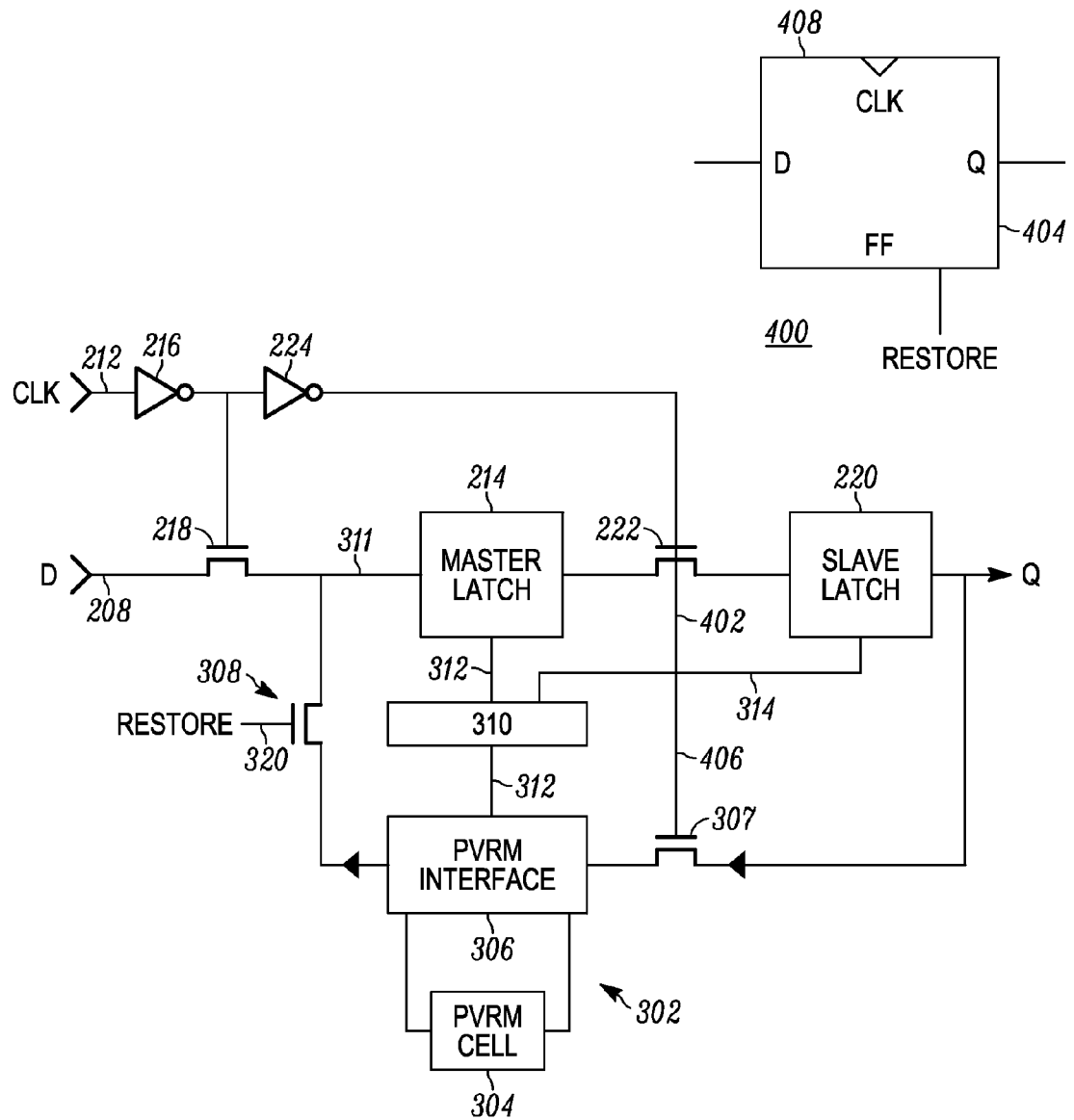
FIG. 4 is a block diagram of a portion of an integrated circuit in accordance with one example set forth in the disclosure.

FIG. 4 illustrates an integrated circuit 400 that employs a memory circuit, in this example a flip-flop that includes a direct backup wherein the output Q is always backed up automatically by the memory state backup circuit 302. In this example, the restore switch 308 which is connected to the input of the active memory circuit, in this case master latch 214, is also connected to an output of the PVRM interface 306. The restore switch 308 is responsive to restore signal 320 to cause the backup data in the PVRM cell 304 to be passed to the input of the master latch 214. The save switch 307 is configured in a different manner from that in FIG. 3. In this example, the save switch 307 has an input 406 that receives the clock signal 212 to clock the output Q of the flip-flop, in this example, out of slave latch 220, into the PVRM cell automatically. The save switch 307 automatically selects output data from an active memory circuit in response to output data being stored in the active memory circuit via clock signal 212. As such, the memory circuit is always backed up and ready to be power gated. The restore operation is still required once power is resumed. Block diagram representation 408 represents a flip-flop requiring only a restore input that includes self activation backup operation.

Figure 5:
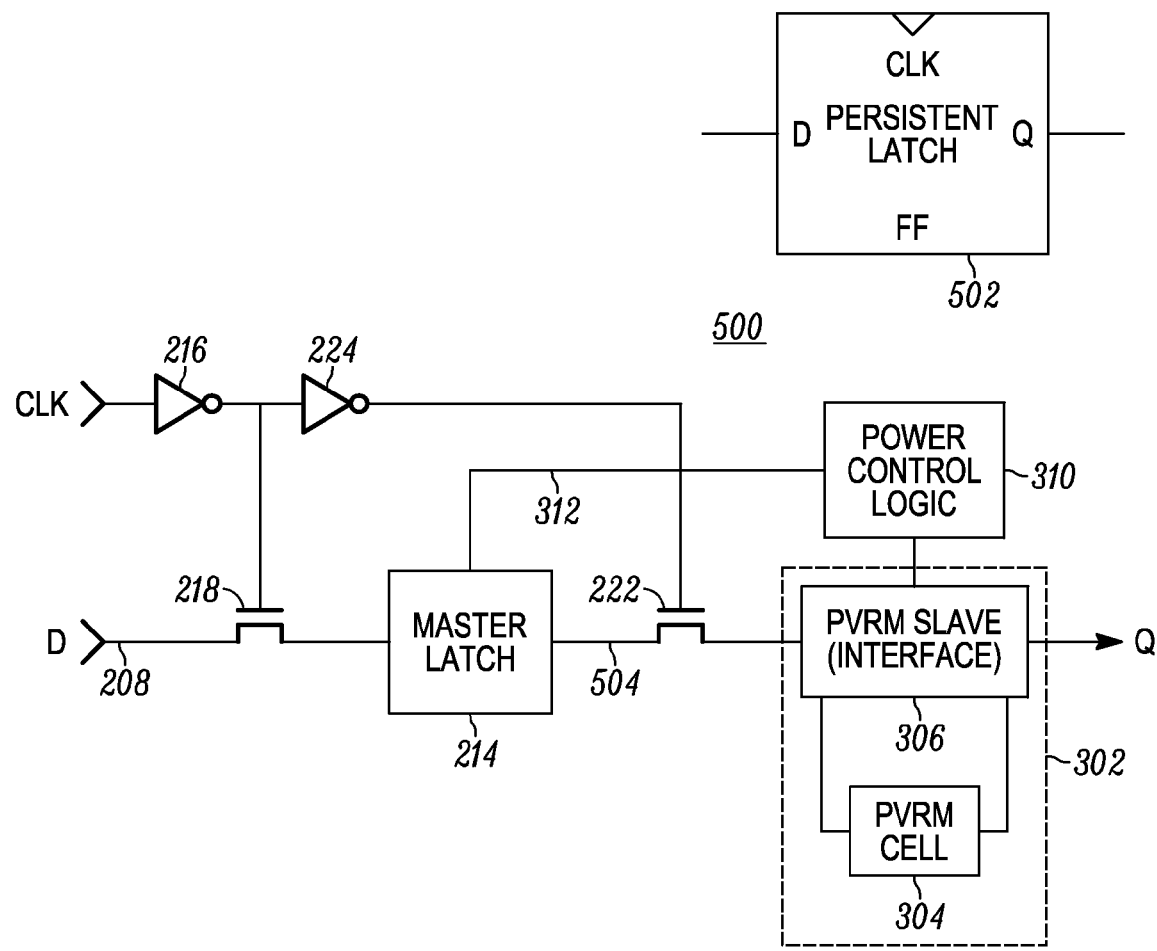
FIG. 5 is a block diagram of a portion of an integrated circuit in accordance with one example set forth in the disclosure.

FIG. 5 illustrates another example of an integrated circuit 500 employing an active memory circuit (an active master latch stage 214) and a passive variable resistance memory slave stage 302 coupled to an output of the active master latch 214 wherein the output is shown as 504. In this example, switch transistor 222 connects the active master latch stage and the passive variable resistance memory slave latch stage. As previously noted, the master latch is made of active CMOS devices or other active devices whereas the PVRM cell is made of a passive variable resistance construction. The PVRM interface 306 in this example is controlled by the switch transistor 222 such that when the output of the master latch is passed via the switch 222, the PVRM interface stores the logic level in the PVRM cell 304. The switch 222 is interposed between the active master latch stage 214 and the passive variable resistance memory slave latch stage 302. The PVRM slave latch stage includes a PVRM cell interface 306 coupled to the switch 222 as well as a PVRM cell 304 coupled to the PVRM cell interface as previously described. The PVRM slave stage stores data such as on the output 504 from the active master latch, in response to clocking of the switch 222 by clock signal. The PVRM slave latch stage 302 stores the data in a non-volatile manner. As such, a PVRM cell is incorporated into the latch structure itself such that the state is always written to the local non-volatile PVRM cell. Power can be removed and restored at any time.

Figure 6:
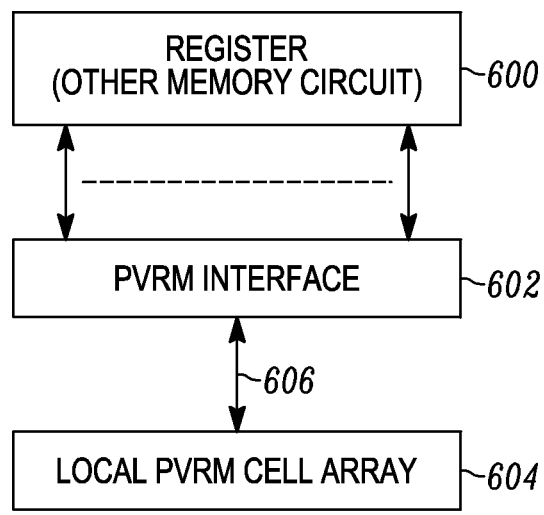
FIG. 6 is a block diagram generally illustrating a register with a memory state backup circuit in accordance with one example set forth in the disclosure.

Although simple flip-flops have been illustrated by way of example, the structures described herein may be applied to a wide variety of memory circuits such as register files that include registers and any other suitable memory circuits. By way of example, FIG. 6 illustrates a register 600 that may include a number of bits wherein each bit is stored in the PVRM cell array 604 which includes an array of bit cells of PVRM non-volatile structures. The PVRM interface 602 instead of simply passing a single bit may read and write a plurality of bits depending upon the size of the register 600. Depending on the size of the memory circuit, an array of rows and columns of PVRM cells may be used.

FIG. 6 illustrates a register that includes a plurality of active memory circuits that form the register as known in the art and also includes a plurality of passive variable resistance memory cells that form a cell array 604. The PVRM cell interface 602 controls reads and writes 606 to each of the PVRM cells to facilitate data backup from the plurality of active memory circuits in the register 608.

Figure 7:
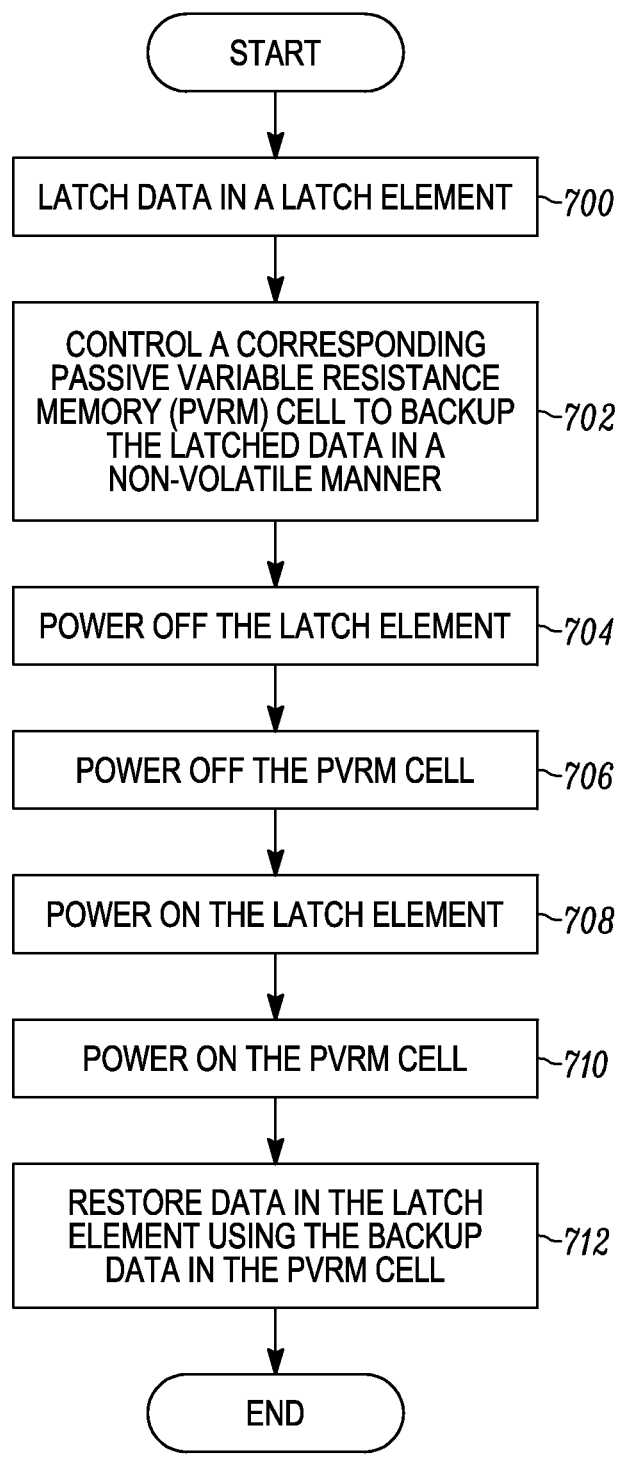
FIG. 7 is a flowchart illustrating one example of a method for providing state backup in an integrated circuit in accordance with one example set forth in the disclosure.

FIG. 7 illustrates a method for providing state backup in an integrated circuit such as the circuits described above. In block 700, the method includes latching data in an active memory circuit such as in master latch 214 via suitable clock signals. As shown in block 702, the method includes controlling a corresponding passive variable resistance cell 304 to backup the latch data (queue), in a non-volatile manner. As such, when power is removed from the PVRM cell, the cell maintains the value of the data. The method includes, as shown in block 704, powering off the active memory circuit such as master latch 214 and slave latch 220 if desired as well as inverters and any other suitable logic in the memory circuit. The method includes powering off the PVRM cell 304 via, for example, the PVRM interface via the PVRM memory control logic 310. When data is to be restored, the method includes powering on the active memory circuit, powering on the PVRM cell and restoring data in the active memory circuit using the backup data in the PVRM cell as shown in blocks 708, 710 and 712. It will be recognized that the ordering of the steps may be in any suitable order and that the order given above is merely an example.

The method may include controlling a corresponding passive variable resistance memory cell to backup the latch data by generating a backup signal to control reading of the data from the active memory circuit to be stored in the PVRM cell. Restoring data in the active memory circuit may include using the backup data in the PVRM cell by generating a restore signal to cause the backup data from the PVRM cell to be input to the active memory circuit such as performed by the circuit in FIG. 3.

Figure 8:
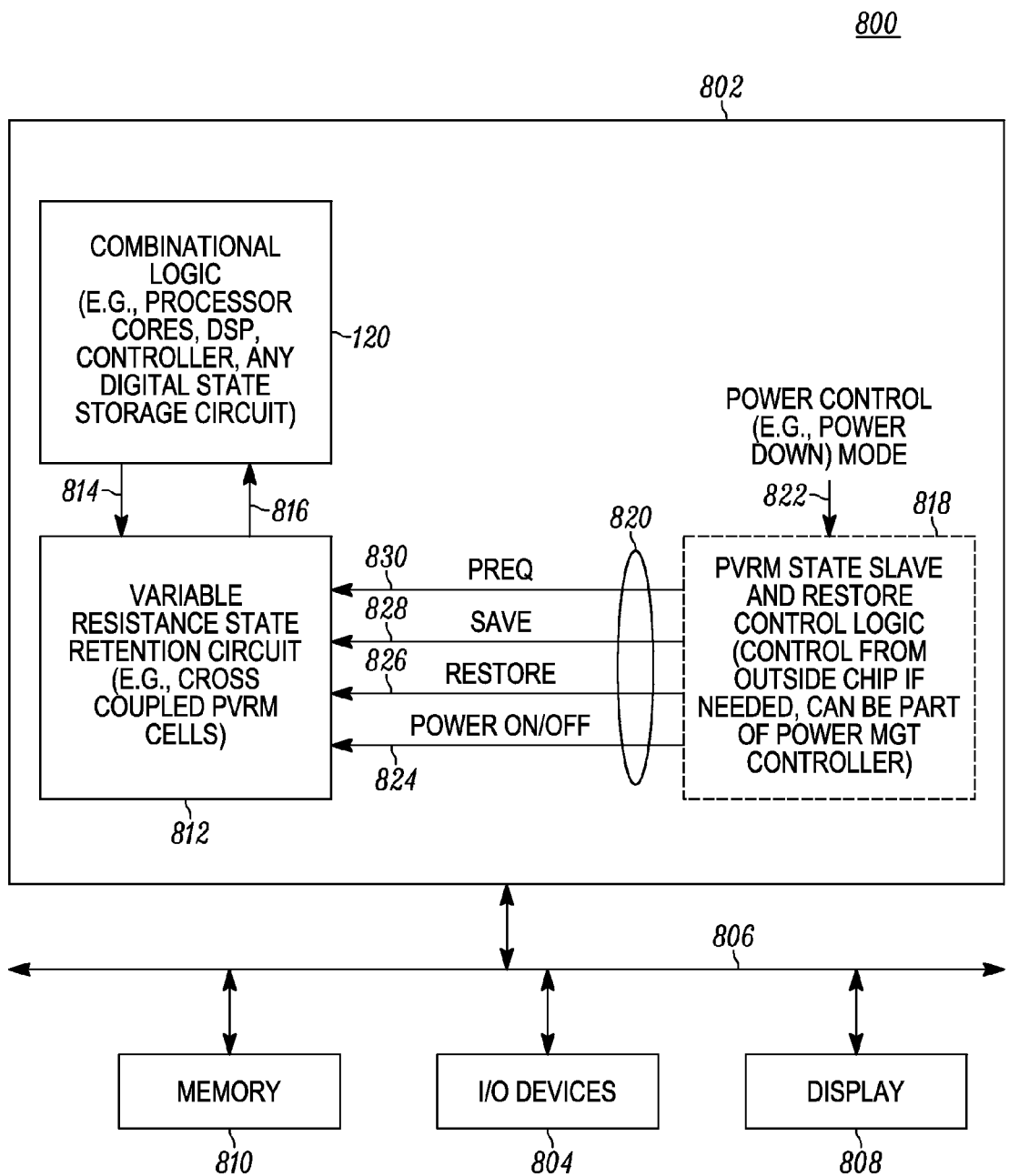
FIG. 8 is a block diagram illustrating one example of an apparatus in accordance with one example set forth in the disclosure.

FIG. 8 is a block diagram illustrating another embodiment of an apparatus 800 that includes at least one active memory circuit such as, for example, flop 120 or any other suitable combinational logic such as, but not limited to as noted above, processor cores, DSP controllers or any suitable digital state storage circuit. In this example, the apparatus includes integrated circuit 802 that is operatively coupled to one or more input/output devices 804 through known bus structures 806. If desired, the apparatus may include a display 808 as well as memory 810 such as but not limited to RAM, ROM or any other suitable memory as known in the art. As shown in this example, a variable resistance state retention circuit 812 stores complimentary state information 814, and restores the saved complimentary state information 816 to the active memory circuit 120 or may restore the state information to any other suitable circuit as desired. The apparatus 800 also includes in this example control logic 818 that provides control information 820 to the variable resistance state retention circuit 812. In this example, the variable resistance state retention circuit 812 is a variable resistance complimentary state retention circuit which saves and restores complimentary state information from or to the at least one active memory circuit 120. The control logic 818 as shown in dashed lines may be integrated into the integrated circuit 802 or may be off-chip. It will be recognized also that other blocks may also be part of the integrated circuit or be on a separate integrated circuits or in other structures as desired.

The control logic 818 is responsive to power control information 820 as described above which may come from a portion of the combinational logic if desired or may come from a power management controller or any other suitable source. The power control information 820 indicates, for example, that the apparatus or any suitable portion thereof such as integrated circuit 802 (or portions thereof) is to be powered down indicating that the state information should be saved. Similarly, the power control information 802 may also indicate that the apparatus 800 or any portion thereof including, for example, integrated circuit 802, is to be powered up or otherwise have an increase in power indicating that the stored state information should be restored for use by the combinational logic 120 or other circuit. In this example, the control signals 820 include a power on/off signal 824, a restore signal 826, a state save signal 828 and a precharge signal 830. These control signals may take any suitable form including one or more bits on a bus, individual control lines, may be analog or digital or any combination as desired. The information also may be stored in register form or may be implemented in any suitable manner. The variable resistance state retention circuit 812 saves complimentary state information 814 from the active memory circuit 120. The variable resistance state retention circuit 812 is also operative to restore the saved complimentary state information 816 either back to the active memory circuit 120 or to any other location as desired.

Figure 9:
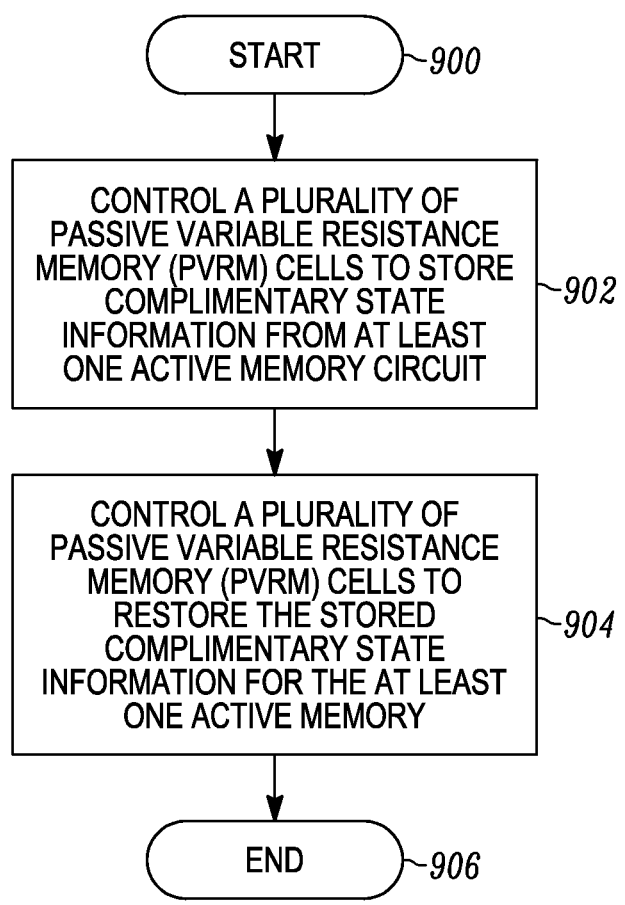
FIG. 9 is an example of a method for storing state information, carried out by an electronic device accordingly to one example set forth in the disclosure.

FIG. 9 illustrates one example of a method for providing state retention in accordance with one aspect of the disclosure. Referring also to FIG. 8, the method includes, for example, in response to the power control signal 822 indicating that a power down mode has been detected, starts in block 900. As shown in block 902, the method includes in response to the power control indication, controlling the variable resistance state retention circuit 812 to store complimentary state information 814 from the active memory circuit 120. In this example, the method includes controlling a plurality of passive variable resistance memory cells to store complimentary state information 814. This is done, for example, by the control logic 818 providing power signal 824 and providing the requisite control signals 820 such as the save control signal 828 (see also FIG. 11).

The control logic 818 may be implemented as a state machine, may be a portion of a suitably programmed processor wherein the processor operates as described, or may take any suitable form.

As shown in block 904, the method includes controlling the variable resistance state retention circuit 812 to restore the stored complimentary state information 816 for the at least one active memory device 120 such as in response to the power control signal 822 indicating a power on condition has occurred. The operation is shown in more detail with respect to FIG. 11 as described hereafter. The controlling of the variable resistance state retention circuit 812 again may be provided by the control logic 818 through the suitable control signals 820 consistent with, by way of example, FIG. 11. For example, to restore saved state information, the restore signal 826 is applied along with the application of the power signal 824 to ensure that power has been applied to the retention circuit after it has been powered down. The precharge signal 830 may also be employed as part of the restore operation as further described below. It will be recognized also that after the saving of the information as set forth in block 902, that the power signal 824 can cause the power to be turned off to the variable resistance state retention circuit to save power. The power is also turned off to the combinational logic 120 as known in the art. This may also be done by the control logic 818 if desired. As shown in block 906, the method may continue to save and restore state information as required based on changing power conditions. In addition, the sequence of operations in terms of the control logic 818 may also be performed similar to that shown in FIG. 7.

Figure 10:
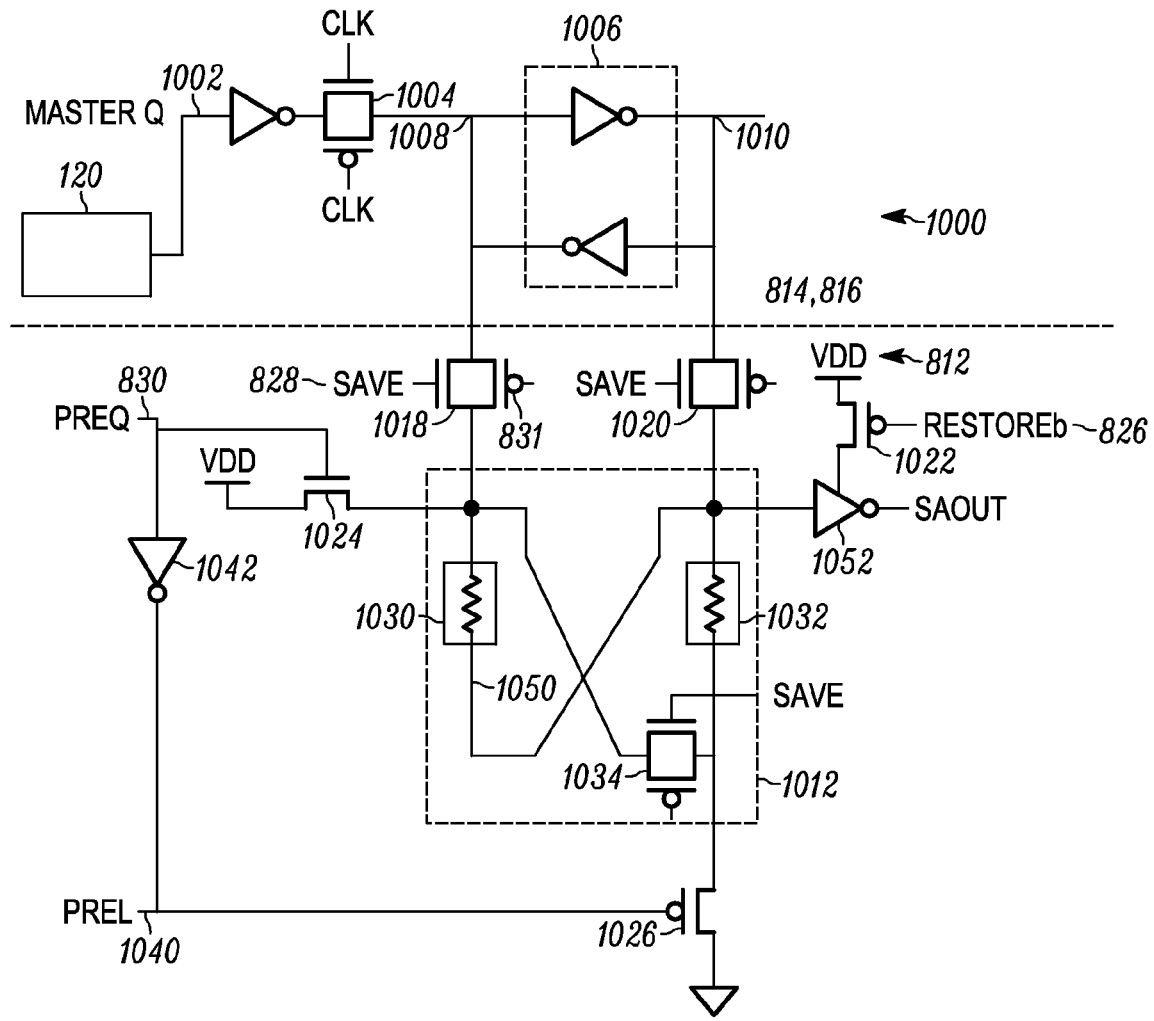
FIG. 10 is a circuit diagram illustrating one example of a variable resistance state retention circuit in accordance with one example set forth in the disclosure.

FIG. 10 is a circuit diagram of a portion of an integrated circuit and illustrates a portion of combinational logic shown as portion 1000 wherein the portion 1000 may be, for example, part of a normal slave flop. However, it will be recognized that the variable resistance state retention circuit 812 may be also coupled to a master flop or any suitable logic that provides state storage. In this example, an input signal 1002 from, for example, a master flop is input through a complimentary pass gate 1004 which is controlled via a clock signal and an inverted clock signal is shown. A pair of back-to-back inverters 1006 which may be part of a slave flop, in this example, receives the input signal 1002 (D) through pass gate 1004. The back-to-back inverters provide complimentary state information 814 in a save mode and 816 in a restore mode across nodes 1008 and 1010. The variable resistance state retention circuit 812 in this example includes a variable resistance cross coupled configured state retention circuit that includes a variable resistance cross coupled configured state retention circuit 1012 which is coupled to the active memory circuit 120 through the pass gate 1004 and the back-to-back inverters 1006. However, any suitable coupling may be provided. The variable resistance state retention circuit 812 also includes control logic in this example shown to include save pass gates 1018 and 1020 and restore switch 1022, switch 1024 and switch 1026. The memory cells in cross coupled configuration 1012 include in this example a first PVRM cell 1030 and a second PVRM cell 1032 and a save pass gate 1034 that is coupled between the pair of PVRM cells 1030 and 1032.

The control logic is operative to save complimentary state information 814 from the active memory circuit 120 such as a flop, to the plurality of variable resistance memory cells 1030 and 1032. The control logic is also operative to restore the stored complimentary state information from the plurality of passive variable resistance memory cells to the active memory 120 by configuring the plurality of variable resistance memory cells 1030 and 1032 in a voltage divider configuration. The other control logic 818 provides the save signal 828 and may also provide an inverted save signal 831. The power on/off signal 824 is used to remove the VDD shown in FIG. 10 to remove power from the state retention circuit after the complimentary state information has been stored or to turn on power to allow restoring of the saved state information. A precharge signal 830 is also employed during the restore operation and an inverted precharge signal 1040 is provided through inverter 1042 to gate 1026. However, it will be recognized that the inverter may be incorporated into the control logic 818 as desired.

The control logic shown in FIG. 10, during a save state is operative to provide opposite voltage pluralities across each of the passive variable resistance memory cells 1030 and 1032 that are in a cross coupled configuration through the pass gate transistor 1034. In the restore configuration, the control logic of FIG. 10 configures the passive variable resistance memory cells 1030 and 1032 to become a voltage divider. The control logic 818 shown in FIG. 8 is operative to shut off the power supply to the variable resistance cross coupled configured state retention circuit 812 via the power on/off signal 824 after the state has been saved, for example, and is also operative to apply power during a restore state condition. This is done in response to the power change condition that may be indicated, for example, by power control signal 822. When the power is shut off to the variable resistance state retention circuit, the PVRM cells that are in the cross coupled configuration save state information during the power off condition.

The disclosed integrated circuit designs may be employed in any suitable apparatus including but not limited to, for example, printers, high definition televisions, handheld devices such as smart phones, tablets, portable devices such as laptops or any other suitable device. Such devices may include for example, a display that is operatively coupled to the integrated circuit where the integrated circuit may be, for example, a GPU, CPU or any other suitable integrated circuit that provides image data for output on the display. Such an apparatus may employ the integrated circuits as noted above including the active memory circuit and memory state backup circuits as described as well as one or more of the described configurations.

As illustrated, the PVRM cells 1030 and 1032 are in a cross coupled save state configuration wherein a first node 1050 (SA_IN) of each of the first and second PVRM cells 1030 and 1032 are coupled to each other. Control logic includes a plurality of complimentary save pass gates 1018 and 1020 that are coupled to a second node of each of the first and second PVRM cells 1030 and 1032. During the save operation, the first and second PVRM cells 1030 and 1032 receive opposite polarity voltages across their respective nodes during a state save mode. The restore bias transistor 1024 is also coupled to the second node of the first PVRM cell and another PVRM restore bias transistor 1026 is coupled to a second node of the second PVRM cell. The restore enable gate 1022 and a sensing inverter 1052 are coupled to the first nodes of each of the PVRM cells and are responsive to the restore signal and the inverter 1052 is responsive to the restore enable switch 1022.

Figure 11:
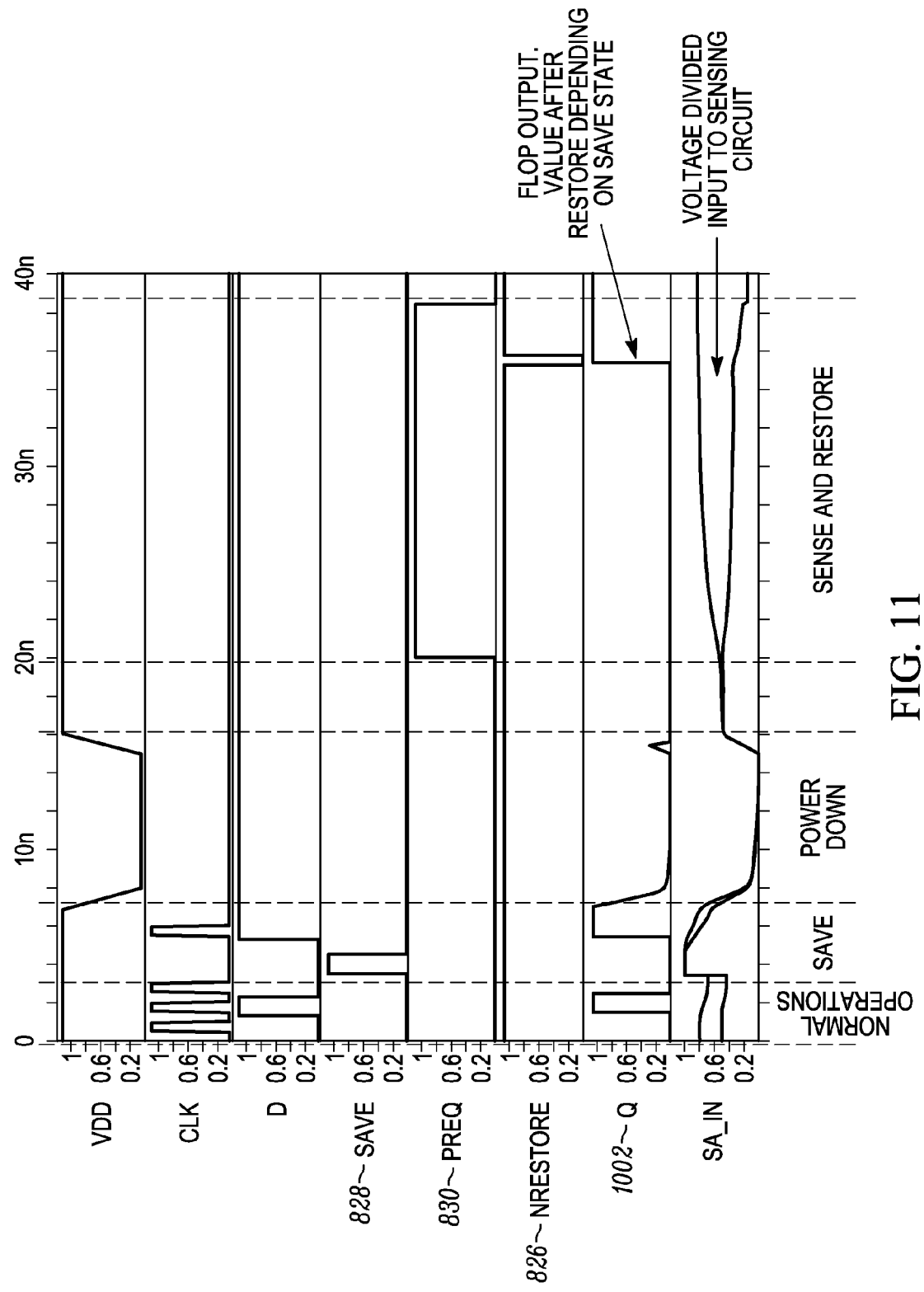
FIG. 11 is a timing diagram illustrating one example of operation of the circuit of FIG. 10.

Referring also to FIG. 11, in operation, during normal operation the save control signal 828 is a logical zero so that the retention circuitry is isolated from the normal flop path. In addition, the precharge signal 830 is logical zero causing the PREL to be logical one and the restore signal 826 is a logical one during normal operation.

When flop state needs to be preserved for a power down mode, the control logic 818 makes the save signal 828 a logical one. As a result, the PVRM cells 1030 and 1032 experience opposite polarities across their terminals, "writing" them to "opposite values", for example, the high resistance state and low resistance state. This assumes that the supply voltage VDD is approximately the write voltage of the PVRM cells. Once the values are saved in the PVRM cells, the voltage supplies can be completely shut off. For example, the supply voltage VDD can be shut off and any other supply voltages if there are any to the combinational logic may be shut off. The non-volatile memristors are PVRM cells and will retain their current high and low resistance states when powered off.

When the supply voltage is powered on and a restore of the complimentary state information is desired, the control logic 818 sets the save control signal 828 to a logical zero and the precharge signal to a logical one. With the save signal equal to logical zero, the retention circuitry is again isolated from the normal flop path. In addition, it also breaks the cross coupled PVRM cell configuration such that the two PVRM cells are now connected in series. The FETs 2014 and 1026 provide the voltage threshold offsets from VDD and VSS such that the voltage across the series PVRM cells is less than the write voltage, preventing PVRM data from being overwritten. As a result, current now flows from VDD to VSS, through the NFET pass gate 1024, the two PVRM cells 1030 and 1032, and finally the PFET pass gate 1026. The ratio of the two PVRM cell resistances results in a voltage at the input of the sensing inverter 1052 that is either above or below the inverter trip point. Since the PVRM cell resistance is expected to be very high, the current draw during this operation is low. Finally, the restore control signal 826 is pulsed low allowing the sensing inverter 1052 to drive an amplified value. The value can go through additional buffering as needed then multiplexed into the slave flop (not shown).

Also, integrated circuit design systems (e.g., work stations including, as known in the art, one or more processors, associated memory in communication via one or more buses or other suitable interconnect and other known peripherals) are known that create wafers with integrated circuits based on executable instructions stored on a computer readable medium such as but not limited to CDROM, RAM, other forms of ROM, hard drives, distributed memory, etc. The instructions may be represented by any suitable language such as but not limited to hardware descriptor language (HDL), Verilog or other suitable language. As such, the logic and circuits described herein may also be produced as integrated circuits by such systems using the computer readable medium with instructions stored therein. For example, an integrated circuit with the aforedescribed logic and structure may be created using such integrated circuit fabrication systems. In such a system, the computer readable medium stores instructions executable by one or more integrated circuit design systems that causes the one or more integrated circuit design systems to produce an integrated circuit. The integrated circuit includes at least one active memory circuit, and at least one memory state backup circuit, operatively coupled to the active memory circuit, including at least one passive variable resistance memory (PVRM) cell and at least one PVRM cell interface operatively coupled to the active memory circuit and to the PVRM cell and operative to back up data to the PVRM cell from the active memory circuit. The produced integrated circuit may also include the other structure and operation set forth above.

In another embodiment, the integrated circuit fabrication system produces an integrated circuit that includes the variable resistance state retention circuit and control logic, for example, illustrated in FIG. 10 as well as any other desired logic such as control logic 818 and any other desired logic.

The above detailed description of the invention and the examples described therein have been presented for the purposes of illustration and description only and not by limitation. It is therefore contemplated that the present invention cover any and all modifications, variations or equivalents that fall within the spirit and scope of the basic underlying principles disclosed above and claimed herein.

What is claimed is:

1. An integrated circuit comprising:
   at least one active memory circuit;
   at least one variable resistance state retention circuit operatively coupled to the at least one active memory circuit and operative to save complimentary state information from the at least one active memory circuit; and
   wherein the at least one variable resistance state retention circuit comprises:
      at least one variable resistance cross coupled configured state retention circuit, operatively coupled to the at least one active memory circuit, comprising:
         a plurality of passive variable resistance memory (PVRM) cells in a cross coupled configuration; and
         control logic operatively coupled to the plurality of passive variable resistance memory (PVRM) cells in a cross coupled configuration, and operative to save state information from the at least one active memory circuit to the plurality of passive variable resistance memory (PVRM) cells in the cross coupled configuration and to restore the stored state information from the plurality of passive variable resistance memory (PVRM) cells to the active memory by configuring the plurality of passive variable resistance memory (PVRM) cells in a voltage divider configuration.

2. The integrated circuit of claim 1 wherein the at least one variable resistance state retention circuit is operative to restore the saved complimentary state information.

3. The integrated circuit of claim 1 comprising passive variable resistance memory (PVRM) state save and restore control logic, operatively coupled to the at least one variable resistance cross coupled configured state retention circuit and operative to provide at least a save signal, a restore signal and a pre-charge signal to control the at least one variable resistance cross coupled configured state retention circuit, in response to a power change condition.

4. The integrated circuit of claim 3 wherein the passive variable resistance memory (PVRM) state save and restore control logic is operative to shut off a power supplied to the at least one variable resistance cross coupled configured state retention circuit and wherein the plurality of passive variable resistance memory (PVRM) cells in the cross coupled configuration save state information during the power off condition.

5. The integrated circuit of claim 1 wherein the control logic, during a state save operation, is operative to provide opposite voltage polarities across each of at least two of the passive variable resistance memory (PVRM) cells in the cross coupled configuration; and wherein the at least two of the passive variable resistance memory (PVRM) cells are configured in a cross coupled configuration by at least one pass gate transistor.

6. The integrated circuit of claim 5 wherein the control logic, during a state restore operation, is operative to reconfigure the at least two passive variable resistance memory (PVRM) cells in the cross coupled configuration to become a voltage divider configuration.

7. The IC of claim 5 comprising a pair of back to back invertors operatively coupled to the second node of the first PVRM cell, to the first node of the second PVRM cell and to the plurality of complimentary pass-gates and wherein during a state save mode, the first and second PVRM cells receive opposite polarity voltages across their respective nodes.

8. The IC of claim 6 comprising a restore enable switch and a sensing inverter operatively coupled to the first nodes of each of the PVRM cells and responsive to the restore enable switch.

9. An integrated circuit comprising:
at least one active memory circuit; and
at least one variable resistance cross coupled configured state retention circuit, operatively coupled to the at least one active memory circuit, comprising:
at least a first passive variable resistance memory (PVRM) cell and at least a second passive variable resistance memory (PVRM) cell in a cross coupled state save configuration wherein a first node of each of the first and second PVRM cells are coupled to each other and wherein a plurality of complimentary pass-gates are coupled to a second node of each of the first and second PRVM cells; and
a first PVRM restore bias transistor operatively coupled to the second node of the first PVRM cell and a second PVRM restore bias transistor operatively coupled a second node of the second PVRM cell.

10. An apparatus comprising:
an input/output device;
at least one processor, operatively coupled to the input/output device, comprising at least one active memory circuit;
a display operatively coupled to the at least one processor;
at least one variable resistance state retention circuit operatively coupled to the at least one active memory circuit and operative to save complimentary state information from the at least one active memory circuit; and
wherein the at least one variable resistance state retention circuit comprises:
at least one variable resistance cross coupled configured state retention circuit, operatively coupled to the at least one active memory circuit, comprising:
a plurality of passive variable resistance memory (PVRM) cells in a cross coupled configuration; and
control logic operatively coupled to the plurality of passive variable resistance memory (PVRM) cells in a cross coupled configuration, and operative to save state information from the at least one active memory circuit to the plurality of passive variable resistance memory (PVRM) cells in the cross coupled configuration and to restore the stored state information from the plurality of passive variable resistance memory (PVRM) cells to the active memory by configuring the plurality of passive variable resistance memory (PVRM) cells in a voltage divider configuration.

11. The apparatus of claim 10 wherein the at least one variable resistance state retention circuit is operative to restore the saved complimentary state information.

12. A method for storing state information carried out by an electronic device comprising:
controlling a plurality of passive variable resistance memory (PVRM) cells in a cross coupled configuration to store complimentary state information from at least one active memory circuit; and
controlling the plurality of passive variable resistance memory (PVRM) cells to restore the stored complimentary state information for the at least one active memory.

13. The method of claim 12 wherein controlling the plurality of passive variable resistance memory (PVRM) cells to restore stored state information for the at least one active memory circuit comprises configuring the plurality of passive variable resistance memory (PVRM) cells in a voltage divider configuration.

14. The method of claim 12 comprising controlling the plurality of passive variable resistance memory (PVRM) cells in the cross coupled configuration to store state information from at least one active memory circuit in response to a power conservation condition.

15. The method of claim 14 comprising reducing power to the plurality of passive variable resistance memory cells after the complimentary state information is stored therein.

16. The method of claim 15 comprising reducing power to the at least one active memory device after the complimentary state information is stored to the plurality of passive variable resistance memory cells.

17. A non-transitory computer readable medium comprising executable instructions that when executed by an integrated circuit fabrication system, causes the IC fabrication system to produce an integrated circuit that comprises:
at least one active memory circuit;

at least one variable resistance state retention circuit operatively coupled to the at least one active memory circuit and operative to save complimentary state information from the at least one active memory circuit; and comprising executable instructions that when executed by the integrated circuit fabrication system cause the integrated circuit fabrication system to produce the at least one variable resistance state retention circuit comprising:

at least one variable resistance cross coupled configured state retention circuit, operatively coupled to the at least one active memory circuit, comprising:

at least a first passive variable resistance memory (PVRM) cell and at least a second passive variable resistance memory (PVRM) cell in a cross coupled state save configuration wherein a first node of each of the first and second PVRM cells are coupled to each other and wherein a plurality of complimentary pass-gates are coupled to a second node of each of the first and second PRVM cells; and a first PVRM restore bias transistor operatively coupled to the second node of the first PVRM cell and a second PVRM restore bias transistor operatively coupled a second node of the second PVRM cell.

* * * * *